United States Patent
Hsu et al.

(10) Patent No.: US 6,858,514 B2
(45) Date of Patent: Feb. 22, 2005

(54) LOW POWER FLASH MEMORY CELL AND METHOD

(75) Inventors: Sheng Teng Hsu, Camas, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/622,667

(22) Filed: Jul. 17, 2003

(65) Prior Publication Data

US 2004/0140504 A1 Jul. 22, 2004

Related U.S. Application Data

(63) Continuation-in-part of application No. 10/112,014, filed on Mar. 29, 2002, now Pat. No. 6,627,510.

(51) Int. Cl.$^7$ .................... H01L 21/762; H01L 23/544
(52) U.S. Cl. ........................ 438/401; 438/975
(58) Field of Search .................. 438/401, 975, 438/FOR 435; 257/797, E23.179

Primary Examiner—George Fourson
(74) Attorney, Agent, or Firm—Matthew D. Rabdau; David C. Ripma; Joseph P. Curtin

(57) ABSTRACT

Flash memory cells are provided with a high-k material interposed between a floating polysilicon gate and a control gate. A tunnel oxide is interposed between the floating polysilicon gate and a substrate. Methods of forming flash memory cells are also provided comprising forming a first polysilicon layer over a substrate. Forming a trench through the first polysilicon layer and into the substrate, and filling the trench with an oxide layer. Depositing a second polysilicon layer over the oxide, such that the bottom of the second polysilicon layer within the trench is above the bottom of the first polysilicon layer, and the top of the second polysilicon layer within the trench is below the top of the first polysilicon layer. The resulting structure may then be planarized using a CMP process. A high-k dielectric layer may then be deposited over the first polysilicon layer. A third polysilicon layer may then be deposited over the high-k dielectric layer and patterned using photoresist to form a flash memory gate structure. During patterning, exposed second polysilicon layer is etched. An etch stop is detected at the completion of removal of the second polysilicon layer. A thin layer of the first polysilicon layer remains, to be carefully removed using a subsequent selective etch process. The high-k dielectric layer may be patterned to allow for formation of non-memory transistors in conjunction with the process of forming the flash memory cells.

8 Claims, 4 Drawing Sheets

LOW POWER FLASH MEMORY CELL AND METHOD

CROSS-REFERENCE

This application is a continuation-in-part of U.S. patent application Ser. No. 10/112,014, filed on Mar. 29, 2002, now U.S. Patent No. 6,627,510, entitled Method of Making Self-Aligned Shallow Trench Isolation, which is incorporated herein by reference.

BACKGROUND OF THE INVENTION

A flash memory cell may be formed on a substrate using a double polysilicon structure, with inter-poly oxide interposed between a floating polysilicon gate and a control polysilicon gate. A tunnel oxide is interposed between the floating polysilicon gate and the substrate.

The programming voltage of a flash memory cell is determined by the field required to generate tunnel current through the tunnel oxide, which is interposed between the floating polysilicon gate and the substrate, for example bulk silicon. The thinner the tunnel oxide and the inter-poly oxide the lower the programming voltage will be. As the oxide layers are thinned, the leakage current increases and the charge retention time is reduced. The required charge retention time sets the lower limit of the thickness of both the tunnel oxide and the inter-poly oxide.

SUMMARY OF THE INVENTION

By replacing the inter-poly oxide, which has been silicon dioxide, with a material having a high-k dielectric constant and low leakage current, the programming voltage can be reduced.

The programming voltage ($V_G$) is applied to the control gate, to produce a voltage at the floating gate ($V_{FG}$). The voltage at the floating gate is given by:

$$V_{FG} = V_G \frac{C_P}{C_P + C_T} = V_G \frac{t_T \varepsilon_P}{t_T \varepsilon_P + t_P \varepsilon_T}$$

where, C is capacitance, t is thickness and $\varepsilon$ is the dielectric constant of the insulator. The subscripts T and P denote that the parameter relates to the tunnel oxide or the inter-poly oxide, respectively. The floating gate voltage increases with increasing tunnel oxide thickness ($t_T$), decreasing inter-poly oxide thickness ($t_P$), and increasing inter-poly oxide dielectric constant ($\varepsilon_P$). Increasing the dielectric constant and decreasing the thickness of the inter-poly oxide is one preferred method of increasing the floating gate voltage, which corresponds to decreasing the programming voltage. Although increasing the tunnel oxide thickness would also increase the floating gate voltage, this option is not preferred, because the tunnel current decreases exponentially with increasing thickness of the tunnel oxide. To maintain desirable tunnel current, the tunnel oxide is preferably maintained as thin as possible. Therefore, one of the preferred methods of reducing the programming voltage is to replace the inter-poly silicon dioxide with a high-k dielectric material.

Accordingly, a flash memory cell structure is provided comprising a high-k dielectric material, for example hafnium oxide or zirconium oxide, interposed between a control gate and a polysilicon floating gate. A tunnel oxide is interposed between the floating gate and a substrate.

Methods of forming flash memory cells are also provided comprising forming a first polysilicon layer over a substrate. Forming a trench through the first polysilicon layer and into the substrate, and filling the trench with an oxide layer. Depositing a second polysilicon layer over the oxide, such that the bottom of the second polysilicon layer within the trench is above the bottom of the first polysilicon layer, and the top of the second polysilicon layer within the trench is below the top of the first polysilicon layer. The resulting structure may then be planarized using a CMP process. A high-k dielectric layer may then be deposited over the first polysilicon layer. A third polysilicon layer may then be deposited over the high-k dielectric layer and patterned using photoresist to form a flash memory gate structure. During patterning, exposed second polysilicon layer is etched. An etch stop is detected at the completion of removal of the second polysilicon layer. A thin layer of the first polysilicon layer remains, to be carefully removed using a subsequent selective etch process. The high-k dielectric layer may be patterned to allow for formation of non-memory transistors in conjunction with the process of forming the flash memory cells.

DETAILED DESCRIPTION OF THE INVENTION

Figure 1:
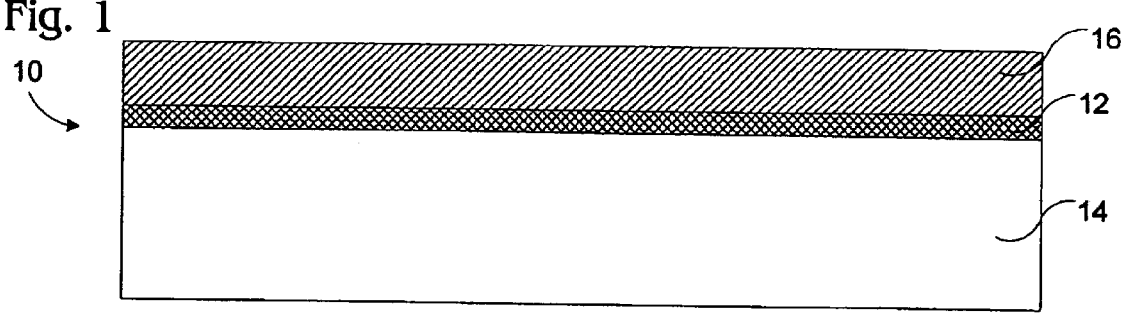
FIG. 1 is a cross section view of a device structure during processing.

For the present method, a semiconductor substrate is provided. An n-well or a p-well may be formed if desired prior to isolating adjacent device areas. Threshold voltage adjustment may also be performed, if desired. Referring now to FIG. 1, a device structure 10 is formed by growing, or growing and depositing a tunnel oxide layer 12 overlying a semiconductor substrate 14 and depositing a first polysilicon layer 16, which may also be referred to as poly 1 throughout this description, overlying the tunnel oxide layer 12, following formation of n-wells or p-wells, if any. The first polysilicon layer 16 serves as a floating polysilicon gate. The thickness of poly 1 is referred to as $T_{p1}$.

Figure 2:
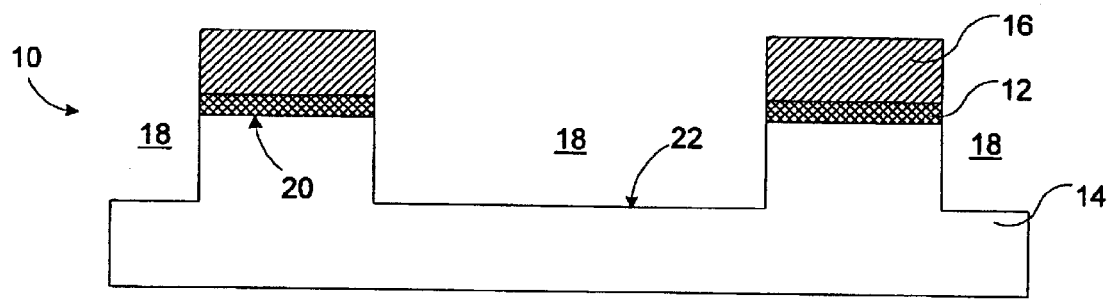
FIG. 2 is a cross section view of a device structure during processing.

FIG. 2 shows a cross-section of the device structure 10 comprising two adjacent device regions 17 following etching of the semiconductor substrate 14 to form trenches 18. The depth of the trenches 18, which is referred to as $X_{STI}$, extends from the top of the substrate surface 20 to the bottom 22 of the trenches 18. The uncertainty, or variation, in the trench depth is referred to as $\Delta X_{STI}$. Following etching of the substrate, a cleaning may be performed to reduce, or eliminate, etch damage.

Figure 3:
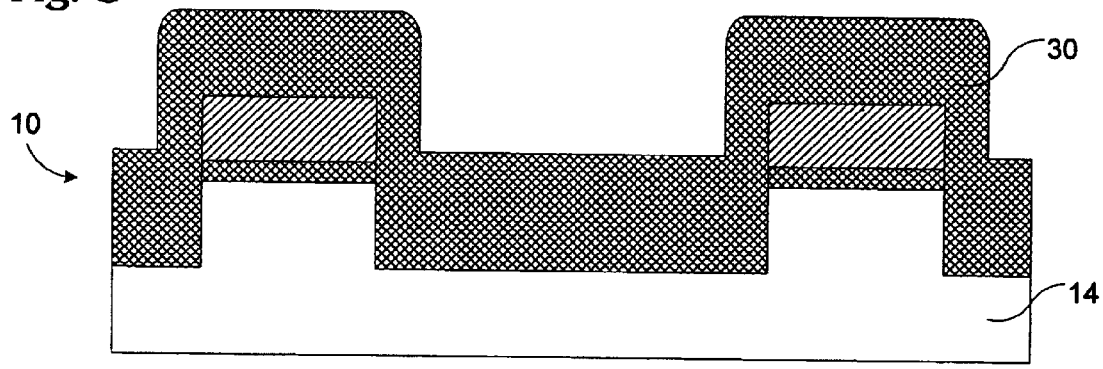
FIG. 3 is a cross section view of a device structure during processing.

FIG. 3 shows the device structure 10 following the deposition of an oxide layer 30. The oxide layer 30 is deposited to refill the trenches with oxide. The oxide layer 30 has a minimum thickness that is greater than the maximum possible depth of the trench. Referring to the oxide thickness as $T_{OX}$, and the uncertainty, or variation, in oxide thickness as $\Delta T_{OX}$, the oxide layer 30 should be deposited and processed so that the final processed thickness satisfies the condition that:

$$T_{OX} - \Delta T_{OX} > X_{STI} + \Delta X_{STI}$$

The oxide may comprise a thin thermal oxide to provide a good interface between the oxide and silicon in the field followed by a deposited oxide. The deposited oxide can be formed by a variety of methods including chemical vapor deposition (CVD) methods, such as, LTO, HPCVD, PECVD, or other CVD methods. Non-CVD methods such as sputtering may also be used. Following deposition of oxide by any suitable method, the oxide may then be densified at a higher temperature, if necessary or desired.

Figure 4:
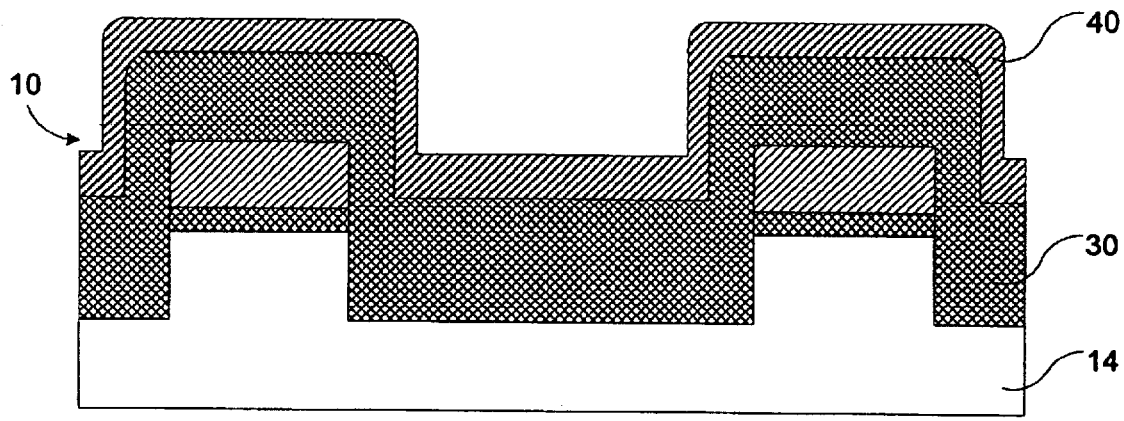
FIG. 4 is a cross section view of a device structure during processing.

As shown in FIG. 4, a second polysilicon layer 40, also referred to herein as poly 2, or field poly, is deposited overlying a device structure 10. The thickness of poly 2 is referred to as $T_{p2}$. Poly 2 should have a thickness selected such that the maximum thickness of poly 2 plus the maximum thickness of oxide layer 30 is thinner than the minimum depth of the trench plus the minimum thickness of poly 1. Accordingly, the thickness of poly 2 should satisfy the condition:

$$T_{p2} + \Delta T_{p2} + T_{OX} + \Delta T_{OX} < X_{STI} - \Delta X_{STI} + T_{p1} - \Delta T_{p1}$$

To satisfy this condition and still have a meaningful thickness of poly2, there is a maximum desired oxide thickness. The maximum oxide layer 30 thickness should satisfy the condition:

$$T_{OX} + \Delta T_{OX} < X_{STI} - \Delta X_{STI} + T_{p1} - \Delta T_{p1} - T_{p2} - \Delta T_{p2}$$

This should result in the top level of the oxide within the trench being above the bottom level of poly 1, and the top level of poly 2 within the trench being below the top level of poly 1.

After poly 2 is deposited, a sacrificial oxide layer, not shown, is deposited overlying the device structure 10. The sacrificial oxide layer may be, for example, undensified TEOS. In one embodiment the sacrificial oxide layer is one and a half times thicker than the maximum thickness of poly 1. In another embodiment, the sacrificial oxide layer should have a thickness such that the combined thickness of the tunnel oxide layer 12, poly 1, the oxide layer 30, poly 2, and the sacrificial oxide layer is approximately two times the total step height of the active area features, which corresponds to the actual physical relief of the top surfaces.

Figure 5:
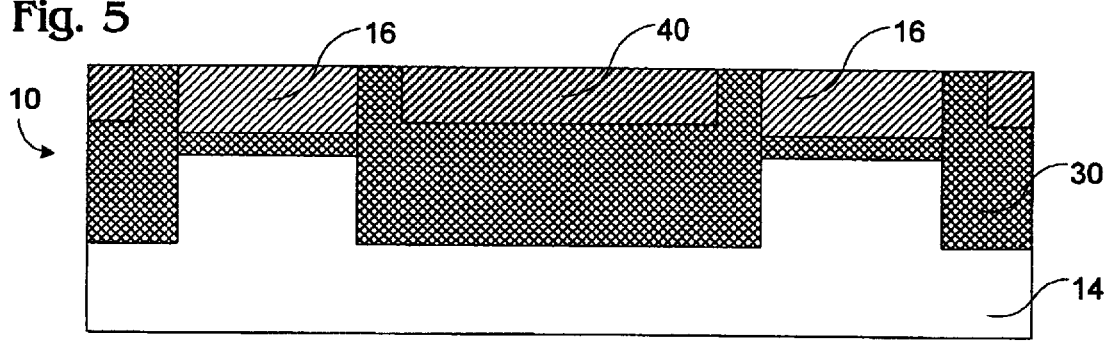
FIG. 5 is a cross section view of a device structure during processing.

Next, as shown in FIG. 5, the device structure 10 is polished using CMP to polish the oxide layer 30 and stop at the top of the second polysilicon layer 40 in the field region. This may be achieved using a two step process. In the first step, a non-selective slurry is used to remove the overlying oxide and the portion of the second polysilicon layer 40 overlying active areas within the device regions. The second step utilizes a selective polish, which continues to remove oxide and stops at the first polysilicon layer 16 in the active areas and at the second polysilicon layer 40 in the field regions. The actual field oxide is not polished in this step. During the selective polish the active areas are much smaller than the field areas and the polish rate of oxide can be selected to be sufficiently higher than that of polysilicon, for example greater than 5:1 oxide to polysilicon etch ratio, so this CMP process can be readily achieved. Since, $$T_{p2} + \Delta T_{p2} + T_{OX} + \Delta T_{OX} < X_{STI} - \Delta X_{STI} + T_{p1} - \Delta T_{p1}$$

the oxide on poly 1 is completely removed before the CMP stop at the field poly 2.

Figure 6:
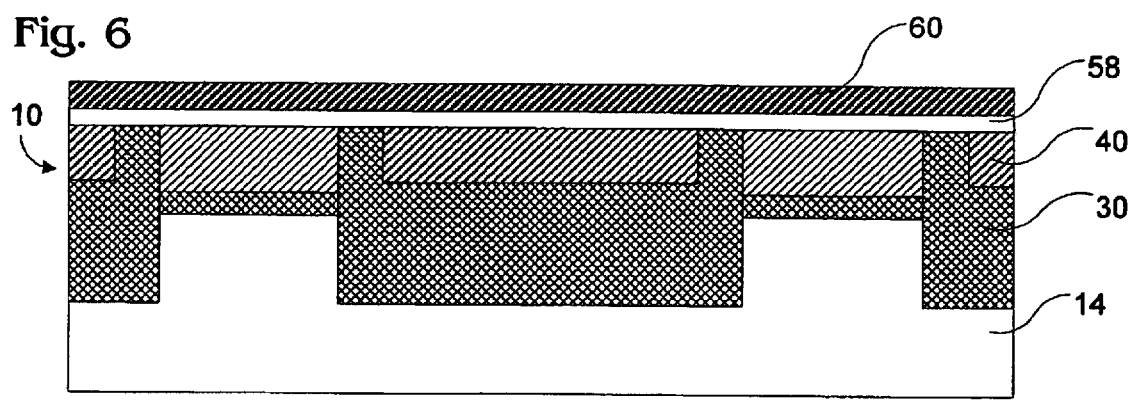
FIG. 6 is a cross section view of a device structure during processing.

As shown in FIG. 6, a high-k dielectric material 58 is deposited overlying the device structure 10 following CMP. A high-k dielectric material refers to a dielectric material with a dielectric constant higher than that of silicon dioxide. Possible preferred high-k dielectric materials include, $ZrO_2$ and $HfO_2$. For example, a 12.9 nm thick film of $ZrO_2$ has a relative dielectric constant of 18 and a leakage current of 200 $nA/cm^2$ at 2 volts. An 8 nm thick film of $HfO_2$ has a relative dielectric constant of 15 and a leakage current of 170 $nA/cm^2$ at 1.5 volts. The leakage current decreases exponentially with the inverse of the square root of thickness. Therefore, the leakage current of thicker $ZrO_2$ and $HfO_2$ is no larger than that of the CVD oxide film. High-k dielectric materials may provide a suitable replacement for the polyoxide material, which is currently being used for flash memory transistors. A third polysilicon layer 60, also referred to herein as poly 3, is deposited overlying the high-k dielectric material 58.

Figure 7:
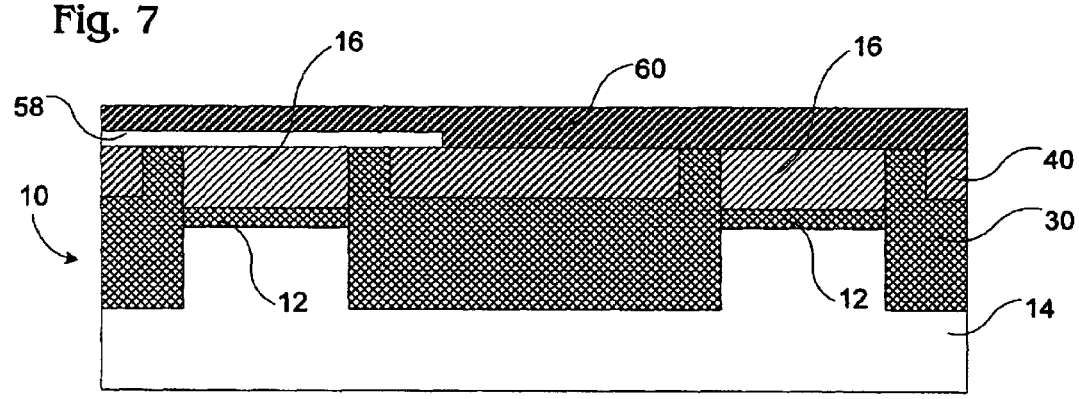
FIG. 7 is a cross section view of a device structure during processing.

Although it is possible to make flash memory cells without non-memory transistors, in one embodiment the flash memory cells will be fabricated on a substrate that also comprises non-memory transistors. When flash memory cells and non-memory transistors are fabricated together it would be preferred to make the process steps as compatible as possible. If non-memory transistors are fabricated with the flash memory cells, a layer of photoresist is applied and patterned to protect the high-k material overlying the flash memory cells. The high-k material may then be etched from the areas overlying the non-memory transistors. The photoresist is then stripped. The third polysilicon layer 60, in this embodiment, is deposited over the remaining high-k dielectric material 58 in the regions where the flash memory cells will be formed, and is deposited over the poly 1 layer 16 in the non-memory transistor regions, as shown in FIG. 7. The actual gate polysilicon thickness of the non-memory transistors will correspond to the sum of the poly 3 thickness plus the thickness of poly 1 that remains after CMP.

In an alternative embodiment involving forming non-memory transistors together with flash memory cells, a layer of sacrificial polysilicon, not shown, is deposited over the high-k material prior applying and patterning the photoresist. The sacrificial polysilicon will be removed from areas overlying non-memory transistors prior to, or in conjunction with, the removal of the high-k material from those areas. This sacrificial polysilicon layer may protect the high-k material during patterning processes, including photoresist strip. When the third polysilicon layer 60 is then deposited it will overly the remaining sacrificial polysilicon over areas with high-k material. Together the sacrificial polysilicon and the polysilicon 60 may form the control gate of the flash memory cell.

Figure 8:
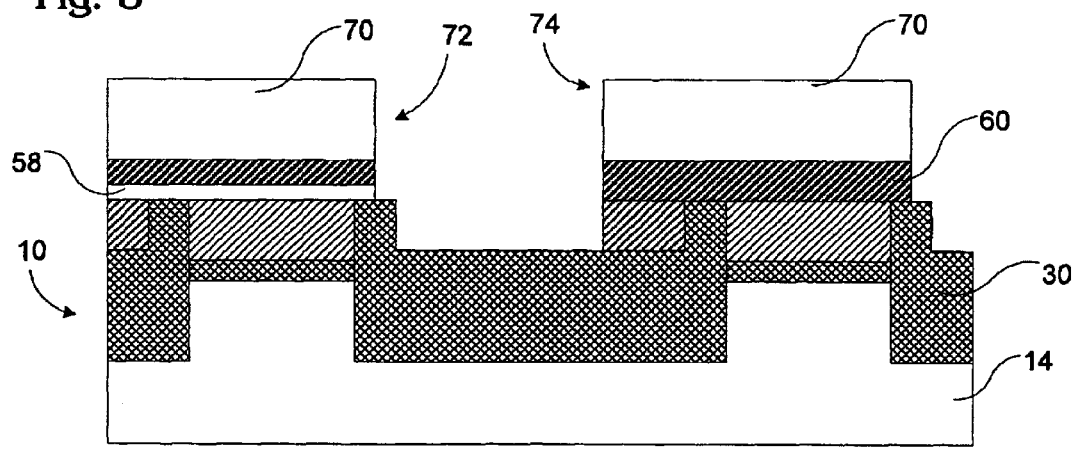
FIG. 8 is a cross section view of a device structure during processing.
Figure 9:
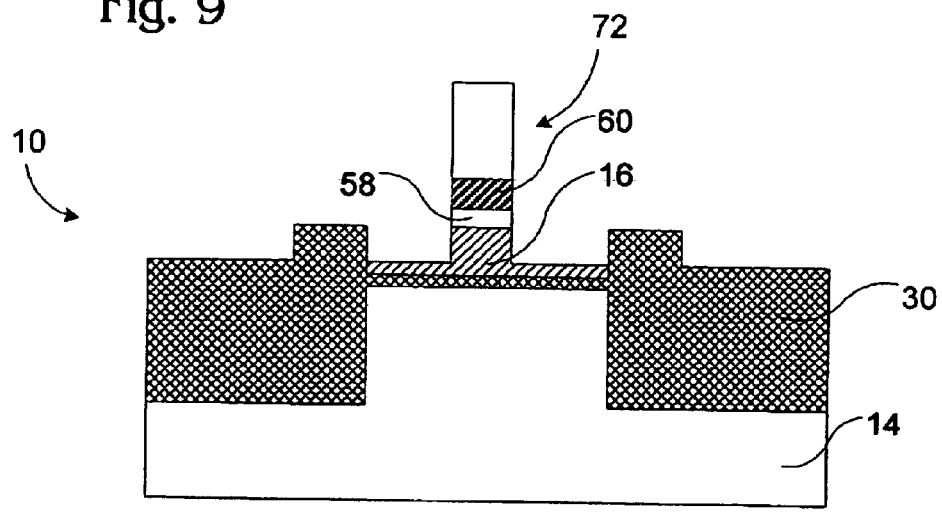
FIG. 9 is a cross section view of a device structure as in FIG. 8, but rotated ninety degrees.

Referring now to FIG. 8, photoresist 70 is applied and patterned to define a flash memory gate structure 72. In some embodiments, non-memory transistor gate structures 74 may be defined together with the definition of the flash memory gate structure 72. A multi-step etch process may be used to etch the poly 3/high-k/poly 1 stack and the poly 3 /poly 2 stack, possibly along with the poly 3 /poly 1 stack, in the case of non-memory transistor structures. Some poly 2 remains under the poly 3 and the photoresist, including under the high-k material if present. Since $T_{OX}-\Delta T_{OX} > X_{STI} + \Delta X_{STI}$, poly 1 is not completely removed from the active region, as shown in FIG. 9, which is a cross-sectional view of the device structure shown in FIG. 8 rotated ninety degrees to show the cross-section along the source/channel/drain of a flash memory transistor structure. The thickness of the remaining poly 1 should be independent of the CMP process. After the second polysilicon layer 40 has been removed, except where it remains under the photoresist, a highly selective etch is used to etch the remaining portion of the first polysilicon layer 16 that is not covered by photoresist. By stopping at the bottom of poly 2 and leaving a thin layer of poly 1 over the tunnel oxide layer 12 and then performing a highly selective etch to remove the remaining thin layer of poly 1, micro-trenching may be reduced, or eliminated. By using high selectivity plasma etching, the remainder of poly 1 can be selectively removed without excessive removal of tunnel oxide 12 in the source and drain region.

Figure 10:
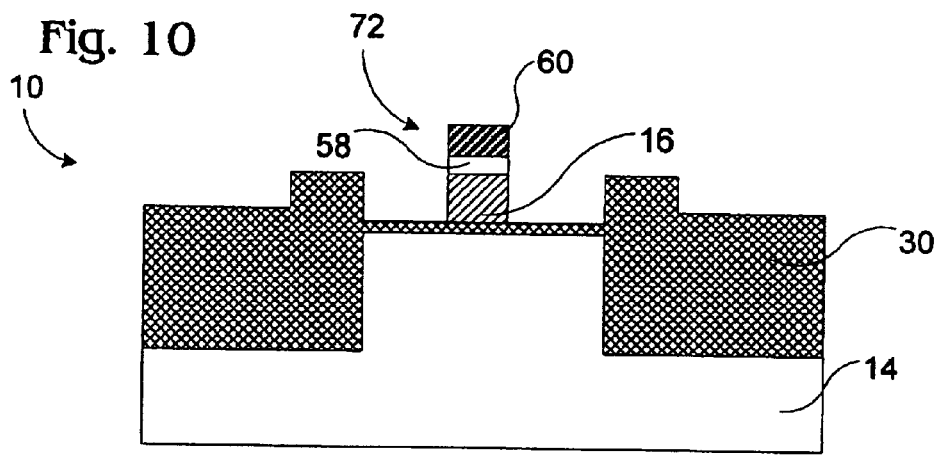
FIG. 10 is a cross section view of a device structure, similar to FIG. 9 following additional processing.

The photoresist is then stripped leaving the flash memory gate structure 72 that comprises the remaining portions of poly 1, high-k material, and poly 3 over each active area, as shown in FIG. 10. Some poly 2 remains under the portion of poly 3 extending beyond the active region, which is not visible in FIG. 10.

Figure 11:
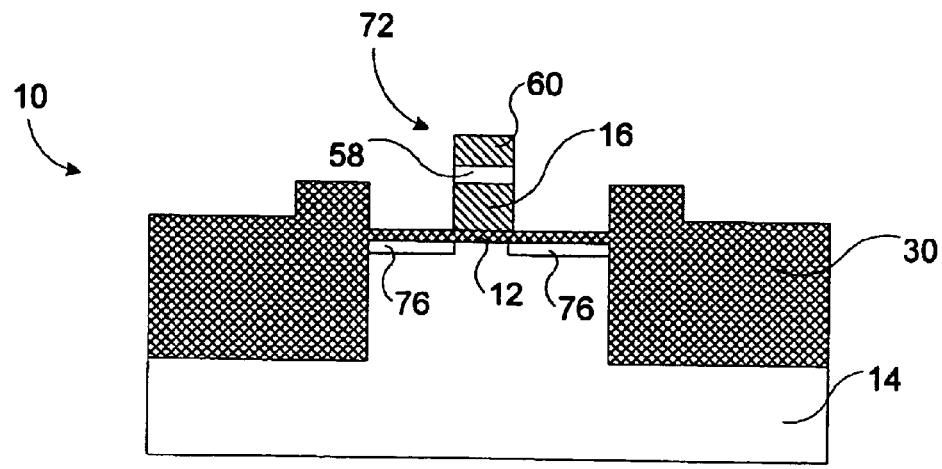
FIG. 11 is a cross section view of a device structure, similar to FIG. 10 following formation of the source and drain regions.

After formation of the gate structure, ion implantation may be used to form source and drain regions that are self-aligned to the gate structure. Poly 1, poly 2, and poly 3 are also converted to n+ or p+ polysilicon as is common in conventional processes. The flash memory gate structure may alternatively be doped prior to the gate electrode etch, and prior to the source and drain ion implant. The polysilicon gate may also be salicided. Several methods of polysilicon gate doping, silicide or self aligned processes, including salicide processes, may be applied to the present process. The flash memory gate structure 72 following doping is shown in FIG. 11, which also shows the implanted source and drain regions 76.

Although exemplary embodiments, including possible variations have been described, the present invention shall not be limited to these examples, but rather the scope of the present invention is to be determined by the following claims.

What is claimed is:

1. A method of making a flash memory cell comprising the steps of:

forming a first polysilicon layer, which has a bottom surface and a top surface, overlying a substrate with a tunnel oxide layer interposed between the substrate and the first polysilicon layer;

forming a trench through the first polysilicon layer, and into the substrate;

forming a field oxide layer, having an upper surface, overlying the substrate to a thickness such that the upper surface of the field oxide layer within the trench is higher than the bottom surface of the first polysilicon layer;

depositing a second polysilicon layer, having an upper surface, overlying the insulating layer to a thickness such that the upper surface of the second polysilicon layer within the trench is lower than the top surface of the first polysilicon layer;

depositing a sacrificial oxide layer over the second polysilicon layer;

planarizing the second polysilicon layer, the field oxide layer, and the first polysilicon layer; and stopping the step of planarizing at the top surface of the first polysilicon layer and the upper surface of the second polysilicon layer;

depositing a high-k dielectric material overlying the second polysilicon layer; and depositing a third polysilicon layer overlying the high-k dielectric material.

2. The method of claim 1, wherein the field oxide layer is formed by growing a thin thermal oxide and then depositing the remainder of the oxide using a CVD process, or sputtering.

3. The method of claim 1, wherein the tunnel oxide layer is silicon dioxide.

4. The method of claim 1, wherein the high-k dielectric material is hafnium oxide or zirconium oxide.

5. The method of claim 3, further comprising the steps of:

depositing and patterning photoresist to define a gate structure;

selectively etching the third polysilicon layer, the high-k dielectric material, the second polysilicon layer, and the first polysilicon layer; and stopping after the removal of exposed regions of the second polysilicon layer, whereby a thin layer of exposed first polysilicon layer remains.

6. The method of claim 5, further comprising the step of selectively etching the remaining exposed first polysilicon layer using a highly selective etch, whereby the remaining exposed first polysilicon layer is removed without excess removal of the underlying tunnel oxide layer.

7. The method of claim 1, further comprising applying and patterning photoresist overlying the high-k dielectric material prior to depositing the third polysilicon layer; and removing high-k material from areas where non-memory transistors are to be formed.

8. The method of claim 7, further comprising depositing a sacrificial polysilicon layer over the high-k dielectric material prior to applying and patterning the photoresist; and removing the sacrificial polysilicon layer from areas where non-memory transistors are to be formed.

* * * * *